US011288482B2

(12) United States Patent
Tan et al.

(10) Patent No.: US 11,288,482 B2
(45) Date of Patent: Mar. 29, 2022

(54) DISPLAY APPARATUS AND DRIVING METHOD OF DISPLAY APPARATUS

(71) Applicant: BOE TECHNOLOGY GROUP CO., LTD., Beijing (CN)

(72) Inventors: Jifeng Tan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 672 days.

(21) Appl. No.: 16/098,686

(22) PCT Filed: Mar. 6, 2018

(86) PCT No.: PCT/CN2018/078111
§ 371 (c)(1),
(2) Date: Nov. 2, 2018

(87) PCT Pub. No.: WO2018/161886
PCT Pub. Date: Sep. 13, 2018

(65) Prior Publication Data
US 2021/0240961 A1 Aug. 5, 2021

(30) Foreign Application Priority Data
Mar. 9, 2017 (CN) .................. 201710138406.X

(51) Int. Cl.
*G06K 9/00* (2006.01)
*G02F 1/133* (2006.01)
(Continued)

(52) U.S. Cl.
CPC ....... *G06K 9/0004* (2013.01); *G02F 1/13312* (2021.01); *G02F 1/29* (2013.01);
(Continued)

(58) Field of Classification Search
CPC .. G06K 9/0004; G06K 9/00013; G06F 3/042; G06F 3/0421; H04N 13/0409; H04N 13/31; G02B 30/30; G02B 27/2214
See application file for complete search history.

(56) References Cited

U.S. PATENT DOCUMENTS

2010/0156850 A1\* 6/2010 Kurokawa .......... G02F 1/13338
345/175
2012/0133618 A1\* 5/2012 Usukura ............. G02F 1/13338
345/175
(Continued)

FOREIGN PATENT DOCUMENTS

CN      204142988 U    2/2015
CN      106298859 A    1/2017
(Continued)

OTHER PUBLICATIONS

Chinese Office Action in Chinese Application No. 201710138406. X, dated May 20, 2019 with English translation.
(Continued)

*Primary Examiner* — Yuzhen Shen
(74) *Attorney, Agent, or Firm* — Collard & Roe, P.C.

(57) ABSTRACT

A display apparatus and a driving method thereof are provided. The display apparatus includes a display panel, a plurality of photosensitive sensors spaced from each other are in a display region of the display panel, an auxiliary panel is on a light emergent side of the display panel, the auxiliary panel has a plurality of light transmitting regions spaced from each other, a light shielding region is between the light transmitting regions adjacent to each other, and light from an object positioned above the auxiliary panel passes through the light transmitting regions and forms an image of the object on the photosensitive sensors.

19 Claims, 7 Drawing Sheets

(51) Int. Cl.
G02F 1/29 (2006.01)
G09G 3/3208 (2016.01)
G09G 3/36 (2006.01)
H01L 27/32 (2006.01)

(52) U.S. Cl.
CPC ......... G09G 3/3208 (2013.01); G09G 3/3611 (2013.01); H01L 27/3227 (2013.01); H01L 27/3232 (2013.01); *G02F 2201/16* (2013.01); *G02F 2201/44* (2013.01); *G09G 2300/023* (2013.01)

(56) References Cited

U.S. PATENT DOCUMENTS

| | | | | |
|---|---|---|---|---|
| 2013/0249896 | A1* | 9/2013 | Hamagishi | H04N 13/351 345/419 |
| 2013/0278847 | A1* | 10/2013 | Hong | G02F 1/29 349/15 |
| 2015/0146118 | A1* | 5/2015 | Seo | G02B 30/27 349/15 |
| 2015/0326850 | A1* | 11/2015 | Kim | H04N 13/359 349/15 |
| 2016/0154994 | A1 | 6/2016 | Kim et al. | |
| 2016/0266695 | A1* | 9/2016 | Bae | G06F 3/04166 |
| 2017/0193270 | A1* | 7/2017 | Zhang | G06F 1/1643 |
| 2018/0107069 | A1* | 4/2018 | Lee | G02F 1/133555 |
| 2018/0165496 | A1* | 6/2018 | Cheng | H01L 27/3227 |
| 2019/0080141 | A1 | 3/2019 | Tan | |

FOREIGN PATENT DOCUMENTS

| | | |
|---|---|---|
| CN | 106355160 A | 1/2017 |
| CN | 106773273 A | 5/2017 |
| KR | 20050072956 A | 7/2005 |

OTHER PUBLICATIONS

International Search Report of PCT/CN2018/078111 in Chinese, dated May 31, 2018, with English translation.
Notice of Transmittal of the International Search Report of PCT/CN2018/078111 in Chinese, dated May 31, 2018.
Written Opinion of the International Searching Authority of PCT/CN2018/078111 in Chinese, dated May 31, 2018 with English translation.

* cited by examiner

DISPLAY APPARATUS AND DRIVING METHOD OF DISPLAY APPARATUS

CROSS REFERENCE TO RELATED APPLICATIONS

This application is the National Stage of PCT/CN2018/078111 filed on Mar. 6, 2018, which claims priority under 35 U.S.C. § 119 of Chinese Application No. 201710138406.X filed on Mar. 9, 2017, the disclosure of which is incorporated by reference.

TECHNICAL FIELD

Embodiments of the present disclosure relate to a display apparatus and a driving method of the display apparatus.

BACKGROUND

With development of fingerprint identification technology, the fingerprint identification technology is widely applied in various fields, for example, electronic terminals such as a mobile phone, a tablet personal computer, a television and the like, and safety protection system such as an entrance guard, a safety box and the like. Fingerprint identification modes of the fingerprint identification technology mainly include an optical fingerprint identification mode, a capacitive fingerprint identification mode, an ultrasonic imaging fingerprint identification mode and the like. The optical fingerprint identification technology has a relatively large identification range and relatively low cost, and thus, the optical fingerprint identification technology has a relatively wide application range.

For example, as for a liquid crystal display of a mobile terminal such as a mobile phone, a working principle of the optical fingerprint identification technology being adopted is that: after a light from a backlight of the liquid crystal display reaches a finger, the light is diffused at the finger, and a portion of diffused light is received by a photosensor. In the diffused light that is received by the photosensor, there is a difference between light energy of light diffused by a wave trough (referred to as a valley hereinafter) of fingerprint and light energy of light diffused by a wave peak (referred to as a ridge hereinafter) of the fingerprint, the light energy of the light diffused by the valley is lower than the light energy of the light diffused by the ridge, and the fingerprint identification is carried out based on such difference.

However, in the above-mentioned fingerprint identification process, on one hand, due to relatively low transmittance of a liquid crystal layer of the liquid crystal display, the light energy reaching the photosensor is very low after the light from the backlight of the liquid crystal display passes through the liquid crystal layer twice; on the other hand, the photosensor only receives a very small part of beam diffused by the finger; and thus, the difference between the light energy of the light diffused by the valley of the fingerprint and the light energy of the light diffused by the ridge of the fingerprint is very small. Furthermore, there is also interference from ambient light between the valley and the ridge of the fingerprint. Thus, the above-mentioned liquid crystal display is very difficult to carry out accurate identification on the fingerprint.

SUMMARY

According to embodiments of the disclosure, a display apparatus is provided. The display apparatus comprises a display panel, a plurality of photosensitive sensors spaced from each other are in a display region of the display panel, an auxiliary panel is on a light emergent side of the display panel, the auxiliary panel has a plurality of light transmitting regions spaced from each other, a light shielding region is between the light transmitting regions adjacent to each other, and light from an object positioned above the auxiliary panel passes through the light transmitting regions and forms an image of the object on the photosensitive sensors.

For example, the display apparatus further comprises a driving circuit. The auxiliary panel includes a first transparent substrate and a second transparent substrate which face to each other, a liquid crystal material filled between the first transparent substrate and the second transparent substrate and a plurality of control electrodes spaced from each other, the driving circuit provides a first driving signal to the plurality of control electrodes, and the first driving signal enables the auxiliary panel to form the plurality of light transmitting regions spaced from each other.

For example, the plurality of control electrodes are all on the first transparent substrate; or the plurality of control electrodes are all on the second transparent substrate; or a portion of the plurality of control electrodes are on the first transparent substrate, and the other portion of the plurality of control electrodes are on the second transparent substrate.

For example, the plurality of control electrodes are on a surface of the first transparent substrate which faces the liquid crystal material and/or a surface of the second transparent substrate which faces the liquid crystal material.

For example, in a case that the plurality of control electrodes are all on the first transparent substrate, any one of the plurality of control electrodes and its adjacent control electrode are respectively on two sides of the first transparent substrate; and in a case that the plurality of control electrodes are all on the second transparent substrate, any one of the plurality of control electrodes and its control electrode are respectively on two sides of the second transparent substrate.

For example, the plurality of control electrodes are in multiple rows or the plurality of control electrodes are in multiple columns.

For example, the driving circuit provides a second driving signal to the plurality of control electrodes, and the second driving signal enables the auxiliary panel to form a grating or a lens with a light splitting function, so that the display apparatus implements a 3D (three dimensional) display.

For example, a length of the photosensitive sensor and a spacing between the light transmitting regions adjacent to each other meet the under-mentioned formula:

$$D1 \geq d;$$

where d represents the spacing between the light transmitting regions adjacent to each other, and D1 represents the length of the photosensitive sensor.

For example, the display apparatus further comprises a backlight module. The backlight module is on a light incident side of the display panel, a plurality of sub-pixels and a black matrix around each of the plurality of sub-pixels are in the display region of the display panel, and each of the plurality of photosensitive sensors is provided in a region in which the black matrix is provided; and the light from the object above the auxiliary panel is a light emitted by the backlight module, reaching the object and diffused by the object.

For example, the display panel is an organic light emitting diode (OLED) display panel, electroluminescent elements of the OLED display panel and the plurality of photosensitive sensors are in a same layer, and each of the plurality of photosensitive sensors is between the electroluminescent elements adjacent to each other; the display apparatus further comprising a polarizer between the display panel and the auxiliary panel; and the light from the object above the auxiliary panel is a light emitted by the electroluminescent elements, reaching the object and diffused by the object.

For example, the display apparatus further comprises another polarizer on a light emergent side of the auxiliary panel.

For example, a light transmission axis of the another polarizer on the light emergent side of the auxiliary panel is in parallel to a light transmission axis of the polarizer between the display panel and the auxiliary panel.

For example, two auxiliary panels are sequentially arranged on the light emergent side of the display panel in a direction perpendicular to the display panel, the driving circuit respectively provides the first driving signal and the second driving signal to the plurality of control electrodes of the two auxiliary panels, so that the two auxiliary panels form orthogonally-superimposed lenses.

For example, in the two auxiliary panels, an extension direction of the plurality of control electrodes of one auxiliary panel and an extension direction of the plurality of control electrodes of the other auxiliary panel are orthogonal with each other.

For example, the light transmitting regions and the light shielding region are only alternatively arranged in a partial region, which overlaps a portion of the display region of the display panel, of the auxiliary panel.

According to the embodiments of the disclosure, a driving method of a display apparatus is provided. The display apparatus is the display apparatus as described above. The driving method comprises: providing a first driving signal to the auxiliary panel, so that the auxiliary panel forms the plurality of light transmitting regions spaced from each other and the light shielding region is formed between the light transmitting regions adjacent to each other; providing another driving signal to the display panel, so that the display panel emits emergent light and the emergent light propagates to the object positioned above the auxiliary panel; and receiving an electric signal sent out by the photosensitive sensors, and acquiring morphology of the object according to the electric signal.

For example, the driving method further comprises: providing a second driving signal to the auxiliary panel, so that the auxiliary panel forms a grating or a lens with a light splitting function, thereby enabling the display apparatus to implement a 3D display.

For example, two auxiliary panels are sequentially arranged on the light emergent side of the display panel in a direction perpendicular to the display panel, and the driving method further comprises: in the two auxiliary panels, providing the first driving signal to one auxiliary panel, and providing a second driving signal to the other auxiliary panel, so that the two auxiliary panels form orthogonally-superimposed lenses.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1:
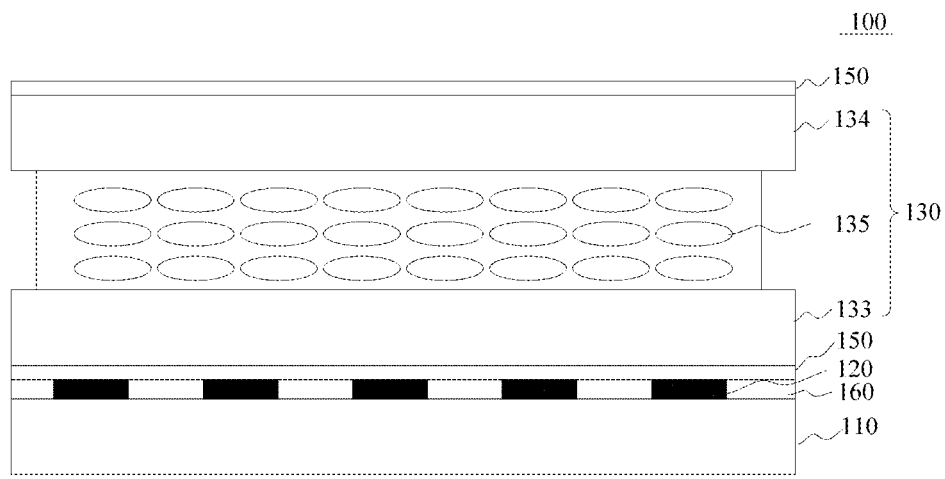
FIG. 1 is a structural schematic diagram I of a display apparatus according to embodiments of the present disclosure.

Reference signs 100: display apparatus; 110: display panel; 120: photosensitive sensor; 130: auxiliary panel; 131: light transmitting region; 132: light shielding region; 133: first transparent substrate; 134: second transparent substrate; 135: liquid crystal material; 136: control electrode; 140: backlight module; 150: polarizer; 160: electroluminescent element.

DETAILED DESCRIPTION

In order to make objects, technical solutions and advantages of the embodiments of the disclosure apparent, the technical solutions of the embodiments of the present disclosure will be described in a clearly and fully understandable way in connection with the drawings. It is obvious that the described embodiments are just a part but not all of the embodiments of the disclosure. Based on the described embodiments herein, those skilled in the art can obtain other embodiment(s), without any inventive work, which should be within the scope of the disclosure.

With reference to FIG. 1, FIG. 2, FIG. 3, FIG. 4 and FIG. 6, embodiments of the present disclosure provide a display apparatus 100. The display apparatus 100 includes a display panel 110, a plurality of photosensitive sensors 120 are in a display region of the display panel 110 and are spaced from each other, an auxiliary panel 130 is on a light emergent side of the display panel 110, the auxiliary panel 130 has a plurality of light transmitting regions 131 spaced from each other, a light shielding region 132 is formed between the light transmitting regions 131 adjacent to each other, and light from an object F positioned above the auxiliary panel 130 passes through the light transmitting regions 131 and forms an image of the object F on the photosensitive sensors 120.

It should be noted that the display panel 110 in the embodiments of the present disclosure should be understood in a broad sense, and the display panel 110 should have an ability of independently implementing image display. According to a light emitting principle of the display panel 110, the display panel 110 for example is a liquid crystal display (LCD) panel, an organic light emitting diode (OLED) display panel and the like. Therefore, the display apparatus in the embodiments of the present disclosure for example includes the LCD panel, the OLED display panel and the like.

It should be noted that, the "light from the object F" is light that is emitted by a light source module (for example, a backlight module or an electroluminescent element) of the display panel 110, reaches the object F, is diffused by the object F to the photosensitive sensor 120 and then received by the photosensitive sensor 120. For example, the photosensitive sensor 120 is a photodiode, and a current generated by the photodiode is changed with intensity of the light received by the photodiode, and thus, the photosensitive sensor 120 determines the difference of the intensity of the received light according to the difference of the electric signal, so that identification of the object F is implemented, and morphology of the object F is determined.

It should be understood that, during the light transmitting region 131 of the auxiliary panel 130 is utilized to carry out the object identification, the display apparatus 100 normally carries out image display. For example, in order that the display apparatus 100 normally carries out the image display, the light transmitting regions 131 and the light shielding regions 132 are alternatively arranged only in a partial region of the auxiliary panel 130, which overlaps a portion of the display region of the display panel 110, so that the partial region of the auxiliary region 130 is used as an identification region; a region, which overlaps the other portions of the display region of the display panel 110, of the auxiliary panel 30 is a transparent region and not used as the identification region. For example, the light transmitting regions 131 and the light shielding regions 132 are alternatively arranged only in the partial region of the auxiliary panel 130, which overlaps an edge of the display region of the display panel 110. For example, a first driving signal is only applied to a control electrode positioned in the identification region.

For example, as mentioned above, the light transmitting regions 131 and the light shielding regions 132 are alternatively arranged only in the partial region of the auxiliary panel 130, which overlaps a portion of the display region of the display panel 110, so that the partial region of the auxiliary region 130 is used as the identification region. Therefore, the identification region covers a portion of the display region of the display panel 110, so that the identification region does not need to be separately arranged outside the display region.

According to the embodiments of the present disclosure, the display apparatus 100 includes the photosensitive sensors 120 and the auxiliary panel 130. In one aspect, the auxiliary panel 130 is configured to have the plurality of light transmitting regions 131 spaced from each other, and the light shielding region 132 is between the light transmitting regions 131 adjacent to each other, and thus, the plurality of light transmitting regions 131 spaced from each other and the light shielding region 132 between the light transmitting regions 131 adjacent to each other form a structure with an aperture. In the case that the object F is above the auxiliary panel 130, the light from the object F forms the image of the object F on the photosensitive sensors 120 after passing through the light transmitting region 131 (i.e. the aperture), and meanwhile, light from a region around the object F is blocked by the light shielding region 132, so that interference light is reduced, and accuracy of object identification is improved. In the case that the object F is a finger of a user, fingerprint identification is accurately implemented. In another aspect, object identification (for example, fingerprint identification) is implemented by utilizing the light transmitting region 131 and the light shielding region 132 of the auxiliary region 130 and the auxiliary panel 130 is stacked on the display panel 110, so that compared to a conventional fingerprint identification display apparatus, the display apparatus 100 according to the embodiments of the present disclosure does not need to separately arrange the identification region for object identification (fingerprint identification), and implements object identification within the display region of the display apparatus 100, and thus, a narrow frame design is achieved, and cost is saved. By the plurality of light transmitting regions 131 spaced from each other and the light shielding regions 132, not only intensity of the light diffused by the object F is increased, but also the light from the region around the object F is blocked, and thus, accuracy of identification of the object F is improved.

Figure 5:
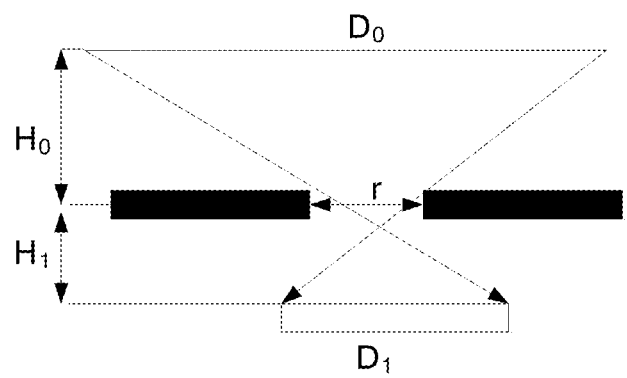
FIG. 5 is a schematic diagram of a light path of aperture imaging.

The design of the light transmitting region 131 (i.e. the aperture) will be illustrated below in connection with FIG. 5 and FIG. 6:

Referring to FIG. 5, it is obtained according to a similar triangle principle that:

$$D_0 = H_0/H_1 * (r+D_1) + r \qquad (1)$$

Where, $D_0$ represents a size of an object plane region, $D_1$ represents a size of an imaging region (for example, a length of the photosensitive sensor), $H_0$ represents a height from an object plane to the light transmitting region, $H_1$ represents a height from an image plane, within which the imaging region is located, to the light transmitting region, and r represents a width of the light transmitting region (i.e., a diameter of the aperture).

According to an aperture imaging principle, D0>D1, and it is known from the formula (1) that: H0>H1.

Figure 6:
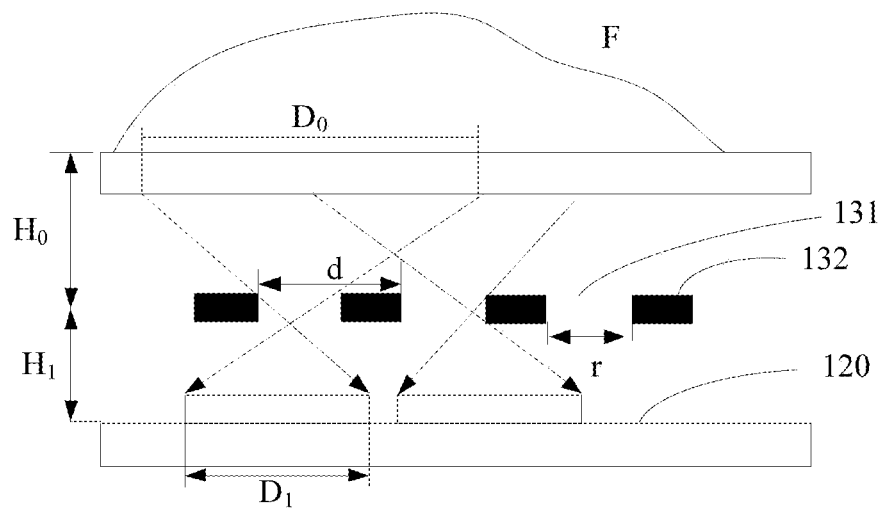
FIG. 6 is a schematic diagram of a light path of imaging by utilizing a light transmitting region (aperture) according to the embodiments of the present disclosure.

It should be noted that light path diagrams in FIG. 5 and FIG. 6 show an image with the width of $D_1$ and an object with the width of $D_0$, and the image with the width of $D_1$ is an image, formed through the aperture with the diameter of r, of the object with the width of $D_0$. For example, the object with the width of $D_0$ is at least a portion of the object F.

In connection with FIG. 6, the imaging regions adjacent to each other do not overlap each other, because an overlapping of the imaging regions adjacent to each other causes reduction of a signal-to-noise ratio, and thus, it should be met that:

$$D_1 \geq d \qquad (2)$$

Where, d represents a spacing between the light transmitting regions adjacent to each other (i.e., a spacing between the apertures adjacent to each other);

Meanwhile, the object plane regions adjacent to each other, which correspond to the imaging regions adjacent to each other, do not overlap each other, and thus, it also should be met that:

$$D0 \geq d \qquad (3)$$

It still should be noted that, in the embodiments of the present disclosure, the structure of the auxiliary panel 130 is not specially limited. For example, a layer with the light transmitting region and the light shielding region is directly formed on the display panel 110 to serve as the auxiliary panel 130.

In order to facilitate the controlling of a size of the light transmitting region 131, for example, the auxiliary panel 130 is a liquid crystal panel. With reference to FIG. 1, FIG. 2, FIG. 3, FIG. 4 and FIG. 7, the above-mentioned display apparatus 100 further includes a driving circuit, and the auxiliary panel 130 includes a first transparent substrate 133 and a second transparent substrate 134 which face to each other. A liquid crystal material 135 is filled between the first transparent substrate 133 and the second transparent substrate 134, and a plurality of control electrodes 136 are provided to space from each other. For example, the plurality of control electrodes 136 are all arranged on the first transparent substrate 133. For example, the plurality of control electrodes 136 are all arranged on the second transparent substrate 134. For example, a portion of the plurality of control electrodes 136 are arranged on the first transparent substrate 133, and the other portion of the plurality of control electrodes 136 are arranged on the second transparent substrate 134. The driving circuit provides the first driving signal to the plurality of control electrodes 136, and the first driving signal enables the auxiliary panel 130 to form the plurality of light transmitting regions 131 spaced from each other. For example, the first driving signal is a voltage signal.

Figure 7:
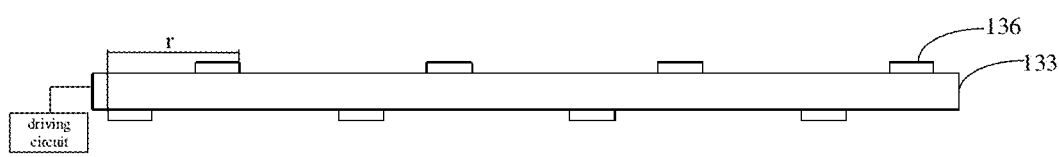
FIG. 7 is a structural schematic diagram of a control electrode according to the embodiments of the present disclosure.

For example, with reference to FIG. 7, illustration is carried out by taking a case that the plurality of control electrodes 136 are positioned on the first transparent substrate 133 and the liquid crystal material 135 is a positive liquid crystal material as an example, the plurality of control electrodes 136 are electrically connected with the driving circuit, respectively. During the object identification is carried out, the first driving signal is provided to the plurality of control electrodes 136 by the driving circuit, and the first driving signal enables the liquid crystal material 135 in the auxiliary panel 130 to deflect so as to form the above-mentioned light transmitting regions 131.

With reference to FIG. 7, it shows that eight control electrodes 136 are arranged on the first transparent substrate 133 as an example, and the above-mentioned driving circuit provides the first driving signal to a portion of the plurality of control electrodes 136. In order to facilitate illustration, for eight control electrodes 136, every two control electrodes 136 form one group along a direction from left to right in FIG. 7. A first group of the control electrodes 136 are applied with the first driving signal, so that an electric field is formed between the two control electrodes 136 in the first group, the liquid crystal material 135 in the region of the electric field is deflected, and long axes of the liquid crystal molecules show a light transmission state, and thus, the above-mentioned light transmitting region 131 is formed between the control electrodes 136 of the first group at the region of the electric field. A second group of control electrodes 136 are not applied with the first driving signal, and thus, the liquid crystal material 135 at the region between the control electrodes 136 of the second group is not deflected so as to form the above-mentioned light shielding region 132.

For example, the above-mentioned aperture imaging structure is designed by designing a width of each control electrode 136 and a spacing between the control electrodes 136 adjacent to each other, designing the length of the photosensitive sensor 120 and controlling the first driving signal provided to the plurality of control electrodes 136 by the driving circuit.

For example, in FIG. 7, the plurality of control electrodes 136 are respectively positioned on two sides of the first transparent substrate 133, so that any one of the plurality of control electrodes 136 and its adjacent control electrode are respectively positioned on two sides of the first transparent substrate 133 to carry out the control on the liquid crystal material 135. For example, in order to control the liquid crystal material 135 better, the plurality of control electrodes 136, for example, are all positioned on a surface of the first transparent substrate 133 which faces the liquid crystal material 135 and/or a surface of the second transparent substrate 134 which faces the liquid crystal material 135, that is, the plurality of control electrodes 136 are all positioned between the first transparent substrate 133 and the second transparent substrate 134.

It should be noted that the spacing between the light transmitting regions 131 adjacent to each other, i.e. a width of the light shielding region 131, is set according to actual demands. For example, the first group of control electrodes 136 are applied with the driving signal, the second group of control electrodes 136 are not applied with the driving signal, a third group of control electrodes 136 are applied with the driving signal, and so on. For example, the first group of control electrodes 136 are applied with the driving signal, the second and third groups of control electrodes 136 are not applied with the driving signal, a fourth group of control electrodes 136 are applied with the driving signal, and so on.

From the above, the light transmitting regions 131 and the light shielding regions 132 constitute the structure with the aperture. Therefore, according to the display apparatus provided by the embodiments of the present disclosure, by utilizing the aperture imaging principle, the light diffused by the object F reaches the photosensitive sensor 120 through the aperture, and meanwhile, the light from the region around the object F is blocked by the light shielding region 132, so that interference light is reduced, and accuracy of object identification is improved. Meanwhile, the display apparatus is simple in structure and saves cost.

For example, the plurality of control electrodes 136 are arranged in multiple rows, or the plurality of control electrodes 136 are arranged in multiple columns.

According to the display apparatus 100 provided by the embodiments of the present disclosure, the plurality of control electrodes 136 are arranged in multiple rows or in multiple columns, and correspondingly, by controlling the plurality of control electrodes 136, the light transmitting regions 131 arranged in multiple rows or in multiple columns are formed, so that accuracy of object identification (for example, fingerprint identification) is further improved.

For example, the above-mentioned driving circuit further provides a second driving signal to the plurality of control electrodes 136, and the second driving signal enables the auxiliary panel 130 to form a grating or a lens with a light splitting function. For example, the second driving signal is a voltage signal.

The display apparatus 100 provided by the embodiments of the present disclosure further implements a 3D display.

Figure 12A:
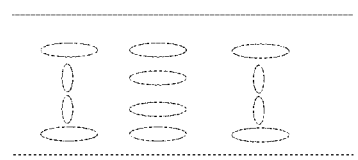
FIG. 12a is a structural schematic diagram of deflection of liquid crystal molecules in the auxiliary panel according to the embodiments of the present disclosure.
Figure 12B:
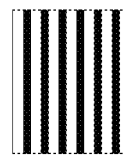
FIG. 12b is a structural schematic diagram that the auxiliary panel forms a grating according to the embodiments of the present disclosure.

For example, the second driving signal is provided by the driving circuit, so that the auxiliary panel 130 forms the grating; the schematic diagram of the formed grating for example refers to FIG. 12a and FIG. 12b; the formed grating blocks a left eye image from entering a right eye of a user and block a right eye image from entering a left eye of the user so as to implement the 3D display. For example, the second driving signal is provided by the driving circuit, so that the auxiliary panel 130 forms the lens with the light splitting function, and light emerging from the light emergent side of the display panel 110 is respectively incident to the left and right eyes of the user through the light splitting lens so as to implement the 3D display.

A principle of forming the lens with the light splitting function and forming the grating so as to implement 3D display will be specifically illustrated below.

A case that the auxiliary panel forms the lens with the light splitting function to implement 3D display will be illustrated as follows.

Figure 8:
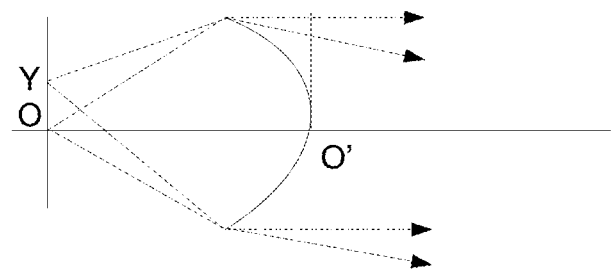
FIG. 8 is a schematic diagram of a light splitting principle of a cylindrical lens.

Firstly, a light splitting principle of a cylindrical lens is illustrated in connection with FIG. 8. A sub-pixel of the display panel 110 is positioned on a focal plane of the cylindrical lens, light emerging from a focus O becomes parallel beams through the cylindrical lens. Light emerging from a Y point above the O point is refracted downwards through the cylindrical lens, and similarly, light emerging from a point below the O point is refracted upwards through the cylindrical lens. Therefore, by utilizing the light splitting effect of the cylindrical lens, the eyes of the user obtain a stereoscopic image so as to implement the 3D display.

For example, the sub-pixel of the display panel 110 is a red sub-pixel, a green sub-pixel or a blue sub-pixel. For example, one red sub-pixel, one green sub-pixel and one blue sub-pixel constitute one pixel unit.

Figure 9:
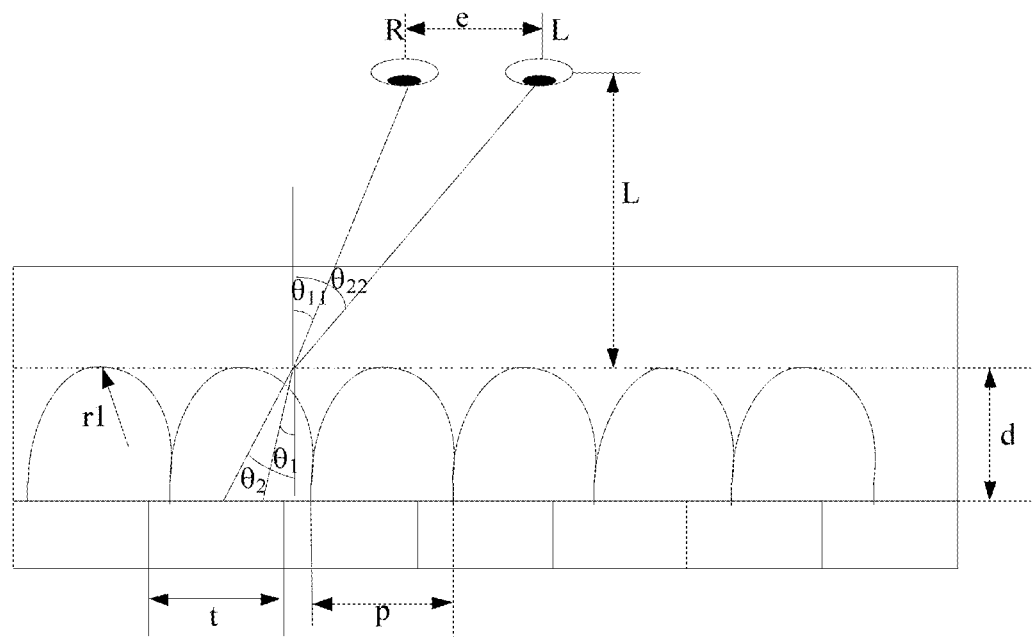
FIG. 9 is a schematic diagram of parameters and a light path of the cylindrical lens according to the embodiments of the present disclosure.

Referring to FIG. 9, two beams of light emitted by the sub-pixel are refracted after passing through an interface between the auxiliary panel (the auxiliary panel forms the lens with the light splitting function) and a medium outside the auxiliary panel, incident angles respectively are $\theta_1$ and $\theta_2$, and refraction angles respectively are $\theta_{11}$ and $\theta_{22}$. A refractive index of the auxiliary panel 130 is $n_2$, and a refractive index of the medium outside the auxiliary panel is $n_1$. Therefore, according to refraction relationships sin $\theta_1*n_2=\sin \theta_{11}*n_1$ and sin $\theta_2*n_2=\sin \theta_{22}*n_1$, it is known that: by regulating the refractive index $n_2$ of the lens formed by the auxiliary panel, two beams of light are respectively incident into the left eye L and the right eye R of the user after being refracted at the interface.

Further referring to FIG. 9, it is obtained that:

$$r_1=t*L*(n_2-1)/e \qquad (4)$$

Where, $r_1$ represents a curvature radius of the cylindrical lens, t represents a width of the sub-pixel, e represents a distance between the left eye L and the right eye R of the user, L represents a distance from the right and left eyes of the user to a front surface of the cylindrical lens, and $n_2$ represents the refractive index of the cylindrical lens (the auxiliary panel).

Therefore, according to the formula (4), the curvature radius $r_1$ of the cylindrical lens is determined.

In addition, as for any one parallax image seen by the eyes of the user, a point seen through the cylindrical lens at an optimal viewpoint shall belong to the parallax image covered by the cylindrical lens, and thus, in the case that m parallax images exist, a pitch p of the cylindrical lens meets that:

$$m*e*t/(e+t)-(m*e*t^2/w)/(e+t)<p<m*e*t/(e+t)+ (m*e*t^2/w)/(e+t) \qquad (5),$$

where, m represents the number of the parallax images, p represents the pitch of the cylindrical lens, and w represents a width of the display panel.

According to the formula (5), an optimal value of the pitch p of the cylindrical lens is $m*e*t/(e+t)$, and a fluctuation range is $(m*e*t^2/w)/(e+t)$.

A thickness d of the above-mentioned cylindrical lens should meet a formula as follows:

$$d=n_2*r_1/(n_2-1) \qquad (6)$$

The derivation of each of the above-mentioned formulas will be illustrated by referring to examples below.

Figure 10:
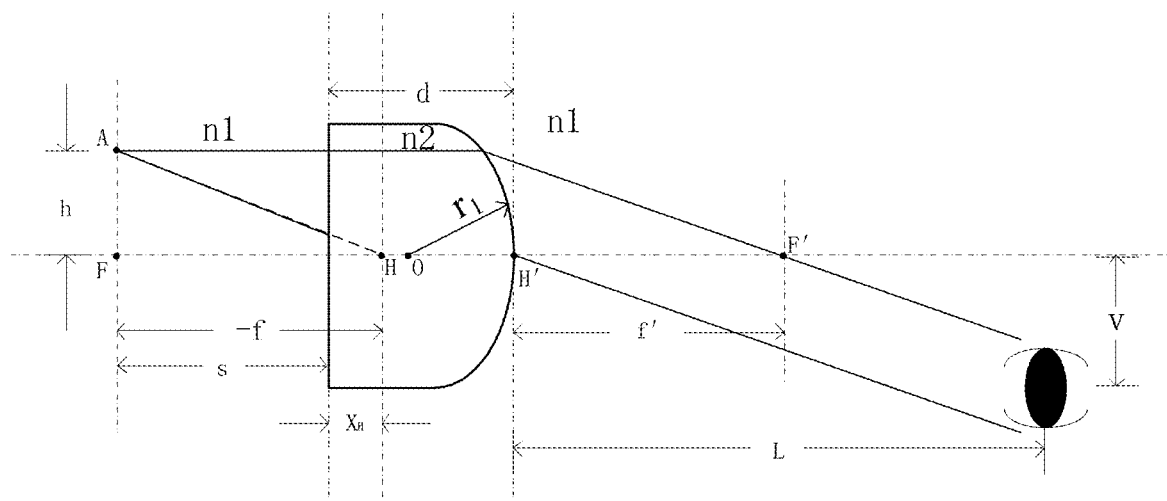
FIG. 10 is a schematic diagram of the light path of the cylindrical lens according to the embodiments of the present disclosure.

With reference to FIG. 10, F and F' respectively represent an object focus and an image focus of the cylindrical lens, H and H' represent an object main point and an image main point of the cylindrical lens, n1 and n2 respectively represent the refractive index of the medium outside the cylindrical lens and the refractive index of the cylindrical lens.

It is known from a basic principle of the geometrical optics that a focal length of the cylindrical lens is that:

$$f'=-f=n2/(n2-n1)*r1 \qquad (7)$$

Where, f' represents an image focal length, f represents an object focal length, and r1 represents a radius of the front surface of the cylindrical lens (i.e., the curvature radius of the cylindrical lens).

A distance from the object main point to a rear surface of the cylindrical lens is that:

$$X_H=n1/n2*d \qquad (8)$$

Where, $X_H$ represents the distance from the object main point to the rear surface of the cylindrical lens, and d represents the thickness of the cylindrical lens.

After the light passes through the object main point or the image main point, a propagation direction of the light is unchanged, so that an included angle between the incident light and an optical axis is equal to an included angle between the emergent light and the optical axis, and thus:

$$h/f'=v/L \qquad (9)$$

Where h represents a distance from an incident point A to the optical axis, v represents a distance from the eye of the user to the optical axis, and L represents a distance from the eye of the user to the front surface of the cylindrical lens.

Figure 11:
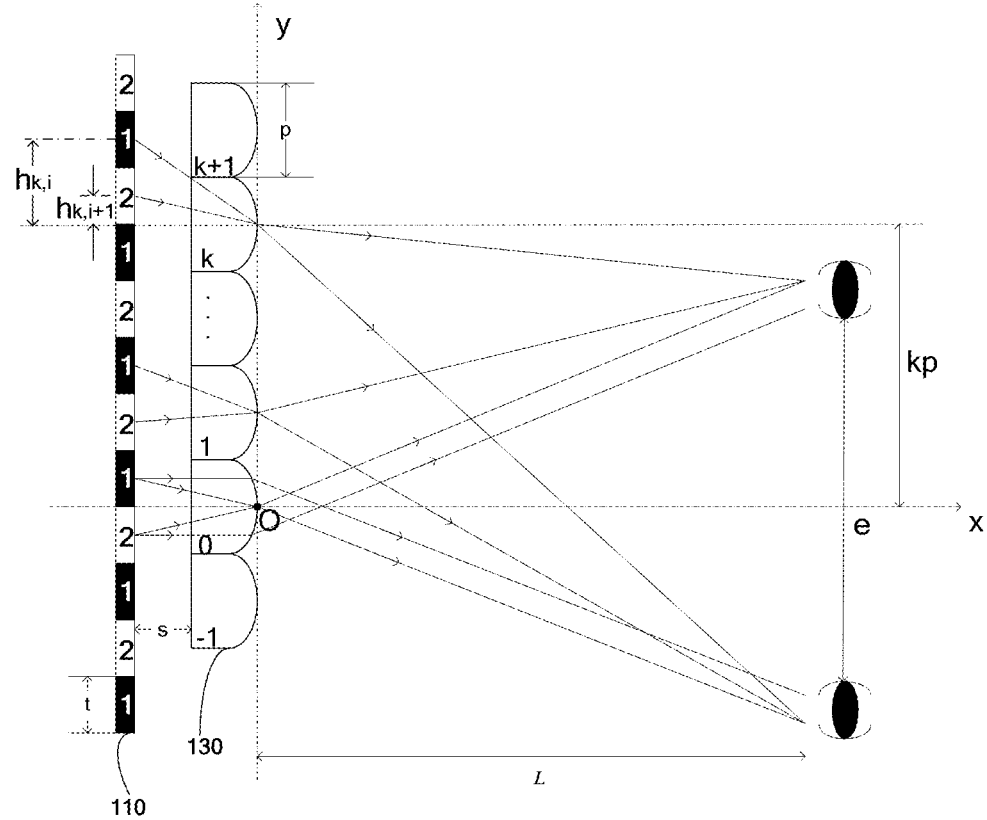
FIG. 11 is a light path diagram that an auxiliary panel forms the cylindrical lens to implement 3D display according to the embodiments of the present disclosure.

With reference to FIG. 11, which is a diagram of a light splitting principle of the cylindrical lens for the 3D display, the display panel 110 is positioned at the position of an object focal plane of the cylindrical lens. A coordinate system as shown in the drawing is established, a coordinate origin is positioned at a vertex of a central cylindrical lens, of which the number is 0, in a cylindrical lens array, an X axis coincides with an optical axis of the central cylindrical lens of which the number is 0, and a Y axis is in parallel to the display panel 110. Along a positive direction of the Y axis, the numbers of the cylindrical lenses respectively are 1, 2, . . . , k, . . . ; and along a negative direction of the Y axis, the numbers of the cylindrical lenses respectively are −1, −2, . . . , −k, . . . .

When the user views the image, the display panel 110 is generally positioned directly in front of the user, and thus, viewpoints of the parallax images are designed to be symmetrically distributed with respect to the X axis. In the case that the 3D display adopts m parallax images, an optimal viewpoint of an $i^{th}$ parallax image is determined at $(1, [i-(m+1)/2)]e)$, where $i=1, 2, 3 \ldots, m$; L represents the distance from the eye of the user to the front surface of the cylindrical lens, e represents a spacing between adjacent parallax points. In the case that m=2, e represents a distance of the eyes of the user, and thus, if a first parallax image is viewed (i=1), viewpoint coordinates of the first parallax image are (1, −e/2); and if a second parallax image is viewed (i=2), viewpoint coordinates are (1, e/2). According to the formula (9), it is obtained that, for a point seen through a $k^{th}$ lens when the eyes are respectively positioned at viewpoints of the $i^{th}$ and $(i+1)^{th}$ parallax images, heights to the optical axis of the cylindrical lens respectively are $h_{k,i}$ and $h_{k,i+1}$.

$$h_{k,i} = f^*(k^*p - (i-(m+1)/2))^* e/L \quad (10)$$

$$h_{k,i+1} = f^*(k^*p - ((i+1)-(m+1)/2))^* e/L \quad (11)$$

Because $$t = h_{k,i} - h_{k,i+1} \quad (12)$$

Where, t represents the width of the sub-pixel of the display panel.

In connection with the formulas (7), (10), (11) and (12), the curvature radius of the cylindrical lens is that:

$$r1 = t^*L(n2-n1)/n1^*e \quad (13)$$

Moreover, the object point of the $i^{th}$ parallax image seen by the eyes through the $m^{th}$ lens should fall within a view field range of the parallax image, i.e., $$m^*k^*t + (m/2-i)^*t < k^*p + h_{k,i} < m^*k^*t + (m/2-i+1)^*t \quad (14)$$

The formulas (7), (10) and (13) are substituted into the formula (14), and it is obtained that:

$$m^*e^*t/(e+t) - e^*t/(2^*k(e+t)) < p < m^*e^*t/(e+t) + e^*t/(2^*k(e+t)) \quad (15)$$

For example, w is the width of the display panel, it is obtained that:

$$w = 2^*k^*m^*t \quad (16)$$

The formula (16) is substituted into the formula (15), and it is obtained that:

$$m^*e^*t/(e+t) - m^*e^*t^*t/w^*(e+t) < p < m^*e^*t/(e+t) + m^*e^*t^*t/w^*(e+t) \quad (17)$$

In the formula, k=1, 2, 3 .... Apparently, w is much greater than e and t, and thus, the suitable value of p is that:

$$p = m^*e^*t/(e+t) \quad (18)$$

The allowable fluctuation range is that: $m^*e^*t^*t/w^*(e+t)$.

For example, in FIG. 11, the number of viewpoints is that m=2, and thus, the pitch of the cylindrical lens is that: $p = 2^*e^*t/(e+t)$.

For example, a placement height of the cylindrical lens is s, it is known from FIG. 11 that:

$$f' = s + X_H \quad (19)$$

The formulas (7) and (8) are substituted into the formula (19), and it is obtained that:

$$d = n2^*r1/(n2-n1) - n2^*s/n1 \quad (20)$$

The case that the auxiliary panel forms the grating to implement 3D display will be illustrated as follows.

Figure 13:
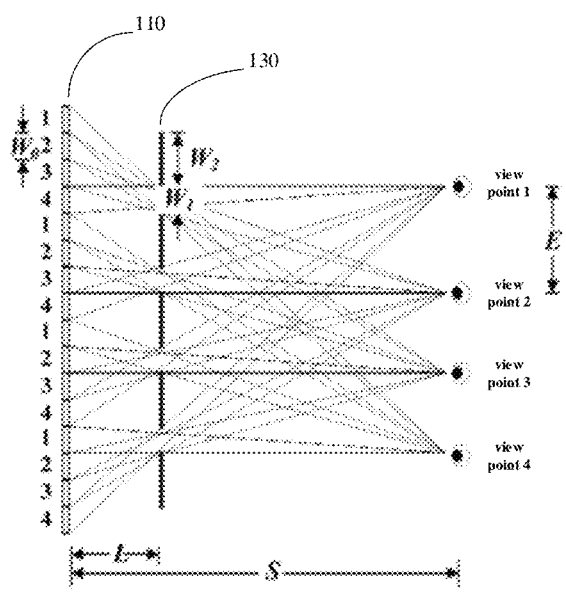
FIG. 13 is a light path diagram that the auxiliary panel forms the grating to implement 3D display according to the embodiments of the present disclosure.
Figure 14:
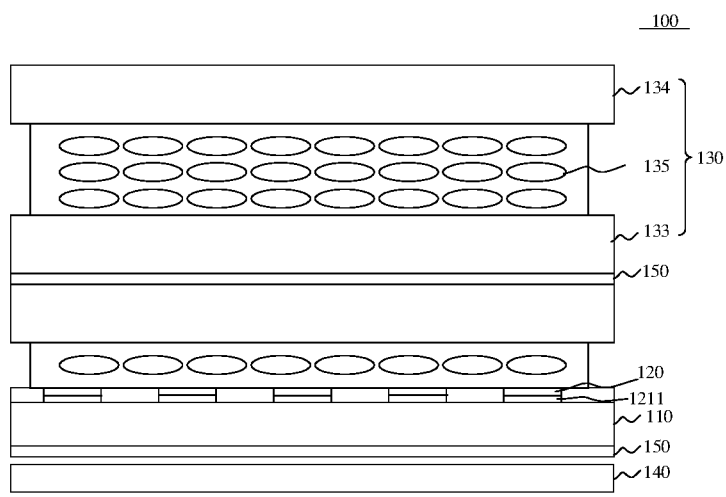
FIG. 14 is a structural schematic diagram V of the display apparatus according to the embodiments of the present disclosure.

With reference to FIG. 12a, FIG. 12b and FIG. 13, illustration is carried out by taking the case of a four-point view as an example, and according to the light path view and the geometrical relationship, it is known that:

$$L = S^*W_0/(E+W_0) \quad (21)$$

$$W_1 = E^*W_0/(E+W_0) \quad (22)$$

$$W_2 = E^*W_0^*(K-1)/(E+W_0) \quad (23)$$

Where, L represents a distance from the grating to the display panel, S represents a distance from the viewpoint to the display panel, $W_0$ represents the width of the sub-pixel of the display panel, E represents a distance between two adjacent viewpoints, $W_1$ represents a width of the light transmitting region, $W_2$ represents a width of the light shielding region, and K represents the number of the viewpoints.

It should be understood that the display apparatus 100 according to the embodiments of the present disclosure not only implements object identification (for example, fingerprint identification) and the 3D display, but also implements the most basic 2D (two dimensional) display. In the case that the display apparatus 100 is required to carry out the 2D display, the characteristics of the liquid crystal material 135 in the auxiliary panel 130 are utilized, the auxiliary panel 130 does not need to be applied with any driving signal, the liquid crystal material 135 in the auxiliary panel 130 is not deflected so as to enable the auxiliary panel 130 to be a transparent panel, and the light emerging from the light emergent side of the display panel 110 transmits through the auxiliary panel 130 without changing the direction, thereby implementing the 2D display of the display apparatus 100. In the case that the 3D display needs to be carried out, the auxiliary panel is applied with the above-mentioned second driving signal, and the second driving signal enables the liquid crystal material 135 in the auxiliary panel 130 to be deflected so as to form the grating or the lens with the light splitting function, thereby implementing the 3D display. In the case that the object identification (for example, fingerprint identification) needs to be carried out, the auxiliary panel is applied with the above-mentioned first driving signal so as to form the light transmitting regions 131 and the light shielding regions 132, which are alternatively arranged.

For example, in the case that the 3D display is carried out, the grating or the lens with the light splitting function is formed in the region, which overlaps an entirety of the display region of the display panel 110, of the auxiliary panel 130. For example, in the case that the object identification (for example, fingerprint identification) is carried out, in order to enable the display apparatus 100 to normally carry out image display, the light transmitting regions 131 and the light shielding regions 132 are only alternatively arranged in the partial region, which overlaps a portion of the display region of the display panel 110, of the auxiliary panel 130.

Figure 2:
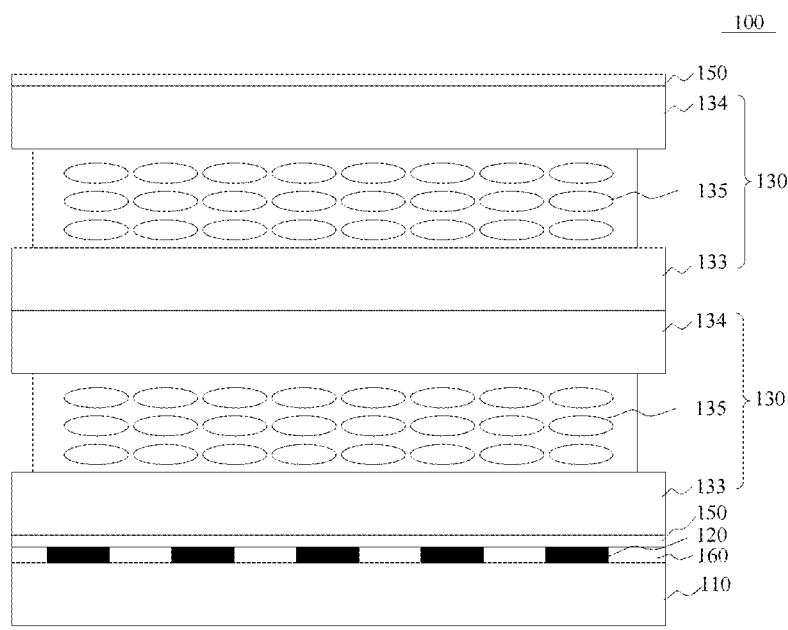
FIG. 2 is a structural schematic diagram II of the display apparatus according to the embodiments of the present disclosure.
Figure 4:
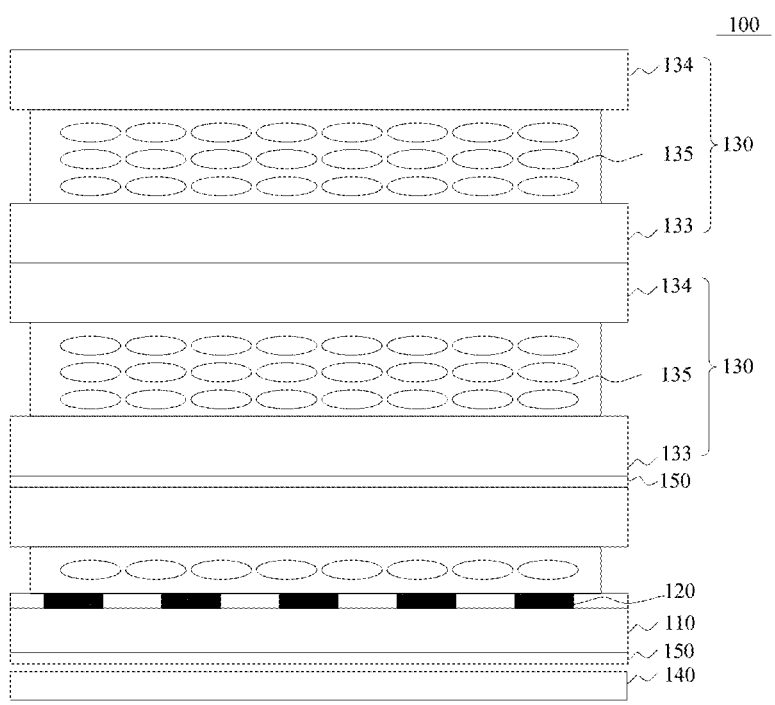
FIG. 4 is a structural schematic diagram IV of the display apparatus according to the embodiments of the present disclosure.

For example, with reference to FIG. 2 and FIG. 4, two auxiliary panels 130 are sequentially arranged on the light emergent side of the above-mentioned display panel 110 in a direction perpendicular to the display panel 110, and the driving circuit is further configured for respectively providing the first driving signal and the second driving signal to the plurality of control electrodes 136 of the two auxiliary panels 130, so that the two auxiliary panels 130 form orthogonally-superimposed lenses. For example, in the two auxiliary panels 130, an extension direction of the plurality of control electrodes 136 of one auxiliary panel and an extension direction of the plurality of control electrodes 136 of the other auxiliary panel are orthogonal with each other.

According to the display apparatus 100 provided by the embodiments of the present disclosure, two auxiliary panels 130 are arranged, the driving circuit is utilized to respectively provide the first driving signal and the second driving signal to the plurality of control electrodes 136 of the two auxiliary panels 130 so that the orthogonally-superimposed lenses are formed, and thus the 3D display performance is improved, meanwhile, the formed light transmitting region 131 is a substantially circular hole, and accuracy of object identification is improved.

Figure 3:
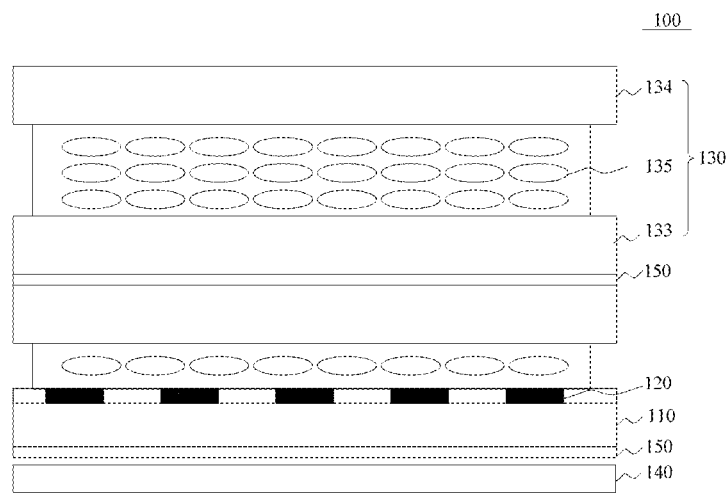
FIG. 3 is a structural schematic diagram III of the display apparatus according to the embodiments of the present disclosure.

For example, with reference to FIG. 3 and FIG. 4, the display apparatus 100 further includes a backlight module 140, the backlight module 140 is positioned on a light incident side of the display panel 110, and a plurality of sub-pixels (with reference to FIG. 9) and a black matrix (not shown in the drawings) arranged around each of the plurality of sub-pixels are arranged in the display region of the display panel 110. For example, each of the plurality of photosensitive sensors 120 is provided in a region in which the black matrix is provided. For example, each of the plurality of photosensitive sensors 120 is positioned in the region in which the black matrix is positioned, and is arranged on a side, which faces the auxiliary panel 130, of the black matrix, so that the black matrix does not block the photosensitive sensors 120 from receiving the light diffused by the object F. For example, each of the plurality of light shielding regions 132 overlaps the black matrix. For example, each of the plurality of light shielding regions 132 is positioned in the region in which the black matrix is positioned. In the case that the object identification (for example, fingerprint identification) is carried out, the object F (for example, the finger) covers the identification region, so that contents displayed in the identification region are not be seen, and thus, the light shielding regions 132 for example are not positioned in the region in which the black matrix is positioned to simplify a production process.

For example, as shown in FIG. 3, the display apparatus 100 according to the embodiments of the present disclosure is a display structure which utilizes the backlight module 140 to implement the light emission of the display panel 110, and by arranging each of the photosensitive sensors 120 in the region in which the black matrix is provided, a manufacturing process of the display apparatus 100 is improved and a thickness of the display apparatus 100 is reduced.

For example, as shown in FIG. 2, the above-mentioned display apparatus 100 includes the OLED display panel, the plurality of photosensitive sensors 120 and the electroluminescent elements 160 of the OLED display panel are arranged in a same layer, and each photosensitive sensor 120 is arranged between two electroluminescent elements 160 adjacent to each other.

For example, the display apparatus 100 according to the embodiments of the present disclosure is a display structure which utilizes self-light emission of the electroluminescent elements 160 to carry out display, and meanwhile, by arranging the photosensitive sensors 120 and the electroluminescent elements 160 in the same layer, the thickness of the display apparatus 100 is reduced, and the production process of the display apparatus 100 is improved.

For example, with reference to FIG. 1 and FIG. 2, the above-mentioned display apparatus 100 is further provided with a polarizer 150, and the polarizer 150 is positioned between the light emergent side of the display panel 110 and the auxiliary panel 130.

It should be noted that for the LCD panel as shown in FIG. 3, in the structure of the LCD panel, the polarizers 150 have been respectively arranged on the light incident side and the light emergent side of the LCD panel, and thus, the emergent light of the LCD panel has been a polarized light. Therefore, in the embodiments of the present disclosure, for the display apparatus including the LCD panel, the polarizer 150 does not need to be separately arranged, and the polarizers 150 of the LCD panel is utilized.

For the OLED display panel, the emergent light of the OLED display panel is an un-polarized light, and thus, the polarizer 150 needs to be arranged on the light emergent side of the OLED display panel (i.e., the polarizer 150 is positioned between the display panel and the auxiliary panel) so as to ensure that the light received by the object is the polarized light, as shown in FIG. 2. For example, arrangement of the polarizer 150 facilitates utilizing the driving circuit to control the plurality of control electrodes 136 so as to enable the auxiliary panel 130 to form the plurality of light transmitting regions 131, and improve contrast of the formed light transmitting regions 131.

For example, in order to further better form the light transmitting region 131 and improve the contrast of the formed light transmitting region 131, in the case that the display apparatus 100 includes the OLED display panel, another polarizer 150 is arranged on a light emergent side of the above-mentioned auxiliary panel 130, as shown in FIG. 2. For example, a light transmission axis of the another polarizer 150 positioned on the light emergent side of the auxiliary panel 130 is in parallel to that of the polarizer 150 positioned between the display panel 110 and the auxiliary panel 130, so that in a case of not applying the driving signal, the auxiliary panel 130 is a light transmission panel (i.e., the auxiliary panel 130 is in a normally white mode), and driving of the display apparatus is simplified.

For example, the display apparatus 100 provided by the embodiments of the present disclosure is applied to electronic products, such as a display, a global positioning system (GPS) navigator, a mobile phone, a notebook computer, a tablet personal computer and the like, and object identification therein not only is applied to fingerprint identification, but also is applied to the fields of palm identification, scanning, a video call and the like.

The embodiments of the present disclosure further provide a driving method of a display apparatus. The display apparatus, for example, is the display apparatus as mentioned above. For example, the driving method includes: providing a first driving signal to an auxiliary panel, so that the auxiliary panel forms a plurality of light transmitting regions spaced from each other and a light shielding region is formed between the light transmitting regions adjacent to each other. For example, an entirety of a region between the light transmitting regions adjacent to each other is the light shielding region, i.e., the light shielding region is positioned between the light transmitting regions adjacent to each other and is respectively in direct contact with the light transmitting regions adjacent to each other.

For example, the first driving signal is a voltage signal, the first driving signal is provided by a driving circuit arranged on the display apparatus or is provided by an external driving circuit arranged outside the display apparatus, and the first driving signal enables the auxiliary panel to form the plurality of light transmitting regions spaced from each other. For example, a liquid crystal material (a positive liquid crystal material is taken as an example) is filled in the auxiliary panel, and deflection of the liquid crystal molecules is implemented under the drive of the first driving signal, so that the above-mentioned light transmitting regions are formed.

For example, the driving method further includes: providing another driving signal to a display panel, so that the display panel emits an emergent light and the emergent light propagates to an object positioned above the auxiliary panel.

For example, in the case that the display apparatus includes an OLED display panel, the another driving signal is an electric signal, the electric signal drives an electroluminescent element in the OLED display panel to emit light, and the light emitted by the electroluminescent element propagates to the object positioned above the auxiliary panel. For example, in the case that the display apparatus includes a LCD panel, the another driving signal is an electric signal sent out by a gate driving circuit, and the electric signal drives the liquid crystal material provided within the LCD panel to be deflected, so that light emitted by a backlight module propagates to the object positioned above the auxiliary panel.

For example, the driving method further includes: receiving an electric signal sent out by a photosensitive sensor, and acquiring morphology of the object according to the electric signal.

For example, by taking the case that the object is a finger of a user as an example, the finger of the user is positioned above the auxiliary panel, the emergent light emitted by the display panel is incident to the finger of the user, the finger of the user receives the light, the light is diffused at the finger of the user, the diffused light reaches the photosensitive sensor positioned in the display apparatus, and due to a difference in a light intensity of the light diffused at a valley and a peak of a fingerprint of the finger of the user, the difference in the light intensity is converted into a difference in the electric signal by the photosensitive sensor, so that the fingerprint identification is carried out according to the difference in the electric signal.

For example, according to actual applications, the object is a palm so as to implement palm identification and the like.

According to the driving method of the display apparatus provided by the embodiments of the present disclosure, the auxiliary panel forms the light transmitting region and the light shielding region, the light transmitting region and the light shielding region constitute the structure with the aperture; by utilizing the aperture imaging principle, the light passes through the aperture and reaches the photosensitive sensor 120 after being diffused by the object, and meanwhile, light from a region around the object is blocked by the light shielding region, so that interference light is reduced, and accuracy of object identification is improved. Therefore, by utilizing the object identification method based on the aperture imaging, the structure with the aperture enables the light diffused by the object to be more accurately reflected onto the photosensitive sensor, so that accuracy of object identification (for example, fingerprint identification) is improved, and furthermore, the method is simple and cost is saved.

For example, the above-mentioned driving method further includes: providing a second driving signal to the auxiliary panel, so that the auxiliary panel forms a grating or a lens with a light splitting function.

The driving method according to the embodiments of the present disclosure not only identifies the object, but also implements a 3D display and a 2D display. In the case that the display apparatus is required to carry out the 2D display, the characteristics of the liquid crystal material in the auxiliary panel are utilized, the auxiliary panel does not need to be separately applied with any driving signal, the liquid crystal material in the auxiliary panel is not deflected so as to enable the auxiliary panel to be a transparent panel, and the light emerging from the light emergent side of the display panel transmits through the auxiliary panel without changing the direction, thereby implementing the 2D display of the display apparatus. In the case that the 3D display needs to be carried out, the second driving signal is provided to the auxiliary panel by the driving circuit, and the second driving signal enables the auxiliary panel to form the grating so as to block a left eye image from entering a right eye of the user and block a right eye image from entering a left eye of the user so as to implement the 2D display of the display apparatus, or the second driving signal enables the auxiliary panel to form the lens with the light splitting function so as to enable the light emerging from the light emergent side of the display panel to be respectively incident to the left and right eyes of the user through the light splitting lens so as to implement the 3D display. The specific principle for example refers to the above, and is not repeated herein.

For example, two auxiliary panels are sequentially arranged on the light emergent side of the display panel in a direction perpendicular to the display panel, and the above-mentioned driving method further includes: providing the first driving signal to one auxiliary panel, and providing the second driving signal to the other auxiliary panel, so that the two auxiliary panels form orthogonally-superimposed lenses.

According to the driving method provided by the embodiments of the present disclosure, different driving signals, i.e., different driving voltages, are respectively provided to the two auxiliary panels, so that the liquid crystal materials in the two auxiliary panels are deflected with different degrees, the orthogonally-superimposed lenses are formed, and the 3D display performance is improved; and meanwhile, the formed light transmitting region is a substantially circular hole, so that accuracy of object identification is improved.

The foregoing embodiments merely are exemplary embodiments of the disclosure, and not intended to define the scope of the disclosure, and the scope of the disclosure is determined by the appended claims.

The invention claimed is:
1. A display apparatus, comprising a display panel, wherein
 a plurality of photosensitive sensors spaced from each other are in a display region of the display panel,
 an auxiliary panel is on a light emergent side of the display panel, the auxiliary panel has a plurality of light transmitting regions spaced from each other, a light shielding region is between the light transmitting regions adjacent to each other, and light from an object positioned above the auxiliary panel passes through the light transmitting regions and forms an image of the object on the photosensitive sensors,
 the display apparatus further comprises a driving circuit,
 the auxiliary panel includes a first transparent substrate and a second transparent substrate which face to each other, a liquid crystal material filled between the first transparent substrate and the second transparent substrate and a plurality of control electrodes spaced from each other,
 two auxiliary panels are sequentially arranged on the light emergent side of the display panel in a direction perpendicular to the display panel, the driving circuit respectively provides a first driving signal and a second driving signal to the plurality of control electrodes of the two auxiliary panels, so that the two auxiliary panels form orthogonally-superimposed lenses.

2. The display apparatus according to claim 1, wherein a length of the photosensitive sensor and a sum of a length of a light transmitting region and a length of the light shielding region meet the under-mentioned formula:

$D1 \geq d;$ where d represents the sum of the length of the light transmitting region and the length of the light shielding region, and D1 represents the length of the photosensitive sensor.

3. The display apparatus according to claim 2, wherein the driving circuit provides a driving signal to the plurality of control electrodes, and the driving signal enables the auxiliary panel to form the plurality of light transmitting regions spaced from each other.

4. The display apparatus according to claim 3, wherein
the plurality of control electrodes are all on the first transparent substrate; or
the plurality of control electrodes are all on the second transparent substrate; or
a portion of the plurality of control electrodes are on the first transparent substrate, and the other portion of the plurality of control electrodes are on the second transparent substrate.

5. The display apparatus according to claim 4, wherein
the plurality of control electrodes are on a surface of the first transparent substrate which faces the liquid crystal material and/or a surface of the second transparent substrate which faces the liquid crystal material.

6. The display apparatus according to claim 4, wherein
in a case that the plurality of control electrodes are all on the first transparent substrate, any one of the plurality of control electrodes and its adjacent control electrode are respectively on two sides of the first transparent substrate; and
in a case that the plurality of control electrodes are all on the second transparent substrate, any one of the plurality of control electrodes and its control electrode are respectively on two sides of the second transparent substrate.

7. The display apparatus according to claim 3, wherein the plurality of control electrodes are in multiple rows or the plurality of control electrodes are in multiple columns.

8. The display apparatus according to claim 3, wherein the driving circuit provides another driving signal to the plurality of control electrodes, and the another driving signal enables the auxiliary panel to form a grating or a lens with a light splitting function, so that the display apparatus implements a 3D (three dimensional) display.

9. The display apparatus according to claim 2, wherein $D0 \geq d$, where $D_0$ represents a width of the object.

10. The display apparatus according to claim 2, further comprising a backlight module, wherein
the backlight module is on a light incident side of the display panel, a plurality of sub-pixels and a black matrix around each of the plurality of sub-pixels are in the display region of the display panel, and each of the plurality of photosensitive sensors is provided in a region in which the black matrix is provided; and
the light from the object above the auxiliary panel is a light emitted by the backlight module, reaching the object and diffused by the object.

11. The display apparatus according to claim 2, wherein the display panel is an organic light emitting diode (OLED) display panel, electroluminescent elements of the OLED display panel and the plurality of photosensitive sensors are in a same layer, and each of the plurality of photosensitive sensors is between the electroluminescent elements adjacent to each other;
the display apparatus further comprises a polarizer between the display panel and the auxiliary panel; and
the light from the object above the auxiliary panel is a light emitted by the electroluminescent elements, reaching the object and diffused by the object.

12. The display apparatus according to claim 11, further comprising another polarizer on a light emergent side of the auxiliary panel.

13. The display apparatus according to claim 12, wherein
a light transmission axis of the another polarizer on the light emergent side of the auxiliary panel is in parallel to a light transmission axis of the polarizer between the display panel and the auxiliary panel.

14. The display apparatus according to claim 2, wherein
the light transmitting regions and the light shielding region are only alternatively arranged in a partial region, which overlaps a portion of the display region of the display panel, of the auxiliary panel.

15. A driving method of a display apparatus, wherein the display apparatus is the display apparatus according to claim 2, and the driving method comprises:
providing a driving signal to the auxiliary panel, so that the auxiliary panel forms the plurality of light transmitting regions spaced from each other and the light shielding region is formed between the light transmitting regions adjacent to each other;
providing another driving signal to the display panel, so that the display panel emits emergent light and the emergent light propagates to the object positioned above the auxiliary panel; and
receiving an electric signal sent out by the photosensitive sensors, and acquiring morphology of the object according to the electric signal.

16. The driving method according to claim 15, further comprising:
providing another driving signal to the auxiliary panel, so that the auxiliary panel forms a grating or a lens with a light splitting function, thereby enabling the display apparatus to implement a 3D display.

17. The driving method according to claim 15, wherein two auxiliary panels are sequentially arranged on the light emergent side of the display panel in a direction perpendicular to the display panel, and the driving method further comprises:
in the two auxiliary panels, providing the first driving signal to one auxiliary panel, and providing a second driving signal to the other auxiliary panel, so that the two auxiliary panels form orthogonally-superimposed lenses.

18. The display apparatus according to claim 1, wherein
in the two auxiliary panels, an extension direction of the plurality of control electrodes of one auxiliary panel and an extension direction of the plurality of control electrodes of the other auxiliary panel are orthogonal with each other.

19. A driving method of a display apparatus, wherein
the display apparatus comprises a display panel, a plurality of photosensitive sensors spaced from each other are in a display region of the display panel, an auxiliary panel is on a light emergent side of the display panel, the auxiliary panel has a plurality of light transmitting regions spaced from each other, a light shielding region is between the light transmitting regions adjacent to each other, and light from an object positioned above the auxiliary panel passes through the light transmitting regions and forms an image of the object on the photosensitive sensors, the driving method comprises: providing a driving signal to the auxiliary panel, so that the auxiliary panel forms the plurality of light transmitting regions spaced from each other and the light shielding region is formed between the light transmitting regions adjacent to each other; providing another driving signal to the display panel, so that the display panel emits emergent light and the emergent light propagates to the object positioned above the auxiliary panel; and receiving an electric signal sent out by the photosensitive sensors, and acquiring morphology of the object according to the electric signal, two auxiliary panels are sequentially arranged on the light emergent side of the display panel in a direction perpendicular to the display panel, and the driving method further comprises: in the two auxiliary panels, providing the first driving signal to one auxiliary panel, and providing a second driving signal to the other auxiliary panel, so that the two auxiliary panels form orthogonally-superimposed lenses.

* * * * *